United States Patent [19]

Satani et al.

[11] Patent Number: 5,369,320
[45] Date of Patent: Nov. 29, 1994

[54] BOOTSTRAPPED HIGH-SPEED OUTPUT BUFFER

[75] Inventors: Norihiko Satani; Shizuo Cho, both of Miyazaki, Japan

[73] Assignee: Oki Electric Industry Co., Ltd., Tokyo, Japan

[21] Appl. No.: 94,614

[22] Filed: Jul. 20, 1993

[30] Foreign Application Priority Data

Jul. 22, 1992 [JP] Japan .................................. 4-194335

[51] Int. Cl.$^5$ .......................................... H03K 17/687
[52] U.S. Cl. .................................... 327/108; 327/390; 327/589; 326/88
[58] Field of Search ............... 307/246, 279, 482, 555, 307/572, 578, 579, 585

[56] References Cited

U.S. PATENT DOCUMENTS

| | | | |
|---|---|---|---|
| 4,388,538 | 6/1983 | Ikeda | 307/578 |
| 4,638,182 | 1/1987 | McAdams | 307/578 |
| 4,707,625 | 11/1987 | Yanagisawa | 307/579 |

FOREIGN PATENT DOCUMENTS

| | | | |
|---|---|---|---|
| 0011537 | 1/1982 | Japan | 307/482 |
| 0063935 | 4/1982 | Japan | 307/482 |
| 59-161921 | 9/1984 | Japan . | |
| 0005618 | 1/1986 | Japan | 307/482 |

OTHER PUBLICATIONS

IBM Technical Disclosure Bulletin, Harroun, "Simple Driver Circuit Providing A Delayed Pulse", 12/77, pp. 2603.

*Primary Examiner*—Timothy P. Callahan
*Assistant Examiner*—Terry D. Cunningham
*Attorney, Agent, or Firm*—Edward D. Manzo

[57] ABSTRACT

An output buffer circuit comprises an input terminal for receiving an input signal, an output circuit coupled to a first node for outputting an output signal in response to a potential level appeared on the first node and a bootstrap circuit coupled between the first node and the input terminal. The bootstrap circuit comprises a delay circuit for delaying the input signal to provide a delayed input signal, a first transistor for receiving a signal inverted from the input signal, a second transistor coupled for receiving the delayed input signal and controlling a the first transistor, a third transistor connected in parallel to the second transistor, a fourth transistor coupled a gate of the third transistor for receiving the input signal and a charge circuit coupled between the delay circuit and the first node for supplying an electric charge to the first node. The charge circuit is activated in response to the potential level appeared on the first node and the delayed input signal.

13 Claims, 2 Drawing Sheets

BOOTSTRAPPED HIGH-SPEED OUTPUT BUFFER

BACKGROUND OF THE INVENTION

This invention relates to a semiconductor integrated circuit such as a semiconductor memory or the like, and particularly to an output buffer circuit having a bootstrap circuit.

An output buffer circuit may have a bootstrap circuit. The bootstrap circuit is provided to output data at high speed and enhance driving capability. The output buffer circuit having the bootstrap circuit has been disclosed in Japanese Patent Application Laid-Open Publication No. 161921/84.

The disclosed output buffer circuit is provided with a bootstrap capacitor. When the bootstrap capacitor is discharged, a potential applied to the gate of an output transistor is raised. A power source potential supplied to the drain of the output transistor is supplied to other circuit through the source of the output transistor without a reduction in the power source potential with an increase in the potential applied to the gate of the output transistor.

There has recently been a demand for the appearance of an output buffer circuit which is simple in circuit configuration and capable of outputting data at high speed.

SUMMARY OF THE INVENTION

It is an object of the present invention to provide an output buffer circuit which is simple in circuit configuration and capable of outputting data at high speed.

The output buffer circuit according to the present invention comprises an input terminal for receiving an input signal, an output circuit coupled to a first node for outputting an output signal in response to a potential level appeared on the first node and a bootstrap circuit coupled between the first node and the input terminal. The bootstrap circuit comprises a delay circuit, a first transistor. a second transistor, a third transistor, a fourth transistor and a charge circuit. The delay circuit couples to the input terminal for delaying the input signal to provide a delayed input signal. The first transistor has a drain electrode coupled to the first node, a source electrode coupled for receiving a signal inverted from the input signal and a gate electrode. The second transistor has a source electrode couples for receiveing the delayed input signal, a gate electrode coupled for receiving a first potential level and a drain electrode coupled to the gate electrode of the first transistor. The third transistor has a source electrode connected in parallel to the second transistor. The fourth transistor has a source electrode coupled for receiving the input signal, a drain electrode coupled to the gate electrode of the third transistor and a gate electrode coupled for receiving the first potential level. The charge circuit couples between the delay circuit and the first node for supplying an electric charge to the first node. The charge circuit is activated in response to the potential level appearing on the first node and the delayed input signal.

DETAILED DESCRIPTION OF THE PREFERRED EMBODIMENTS

The configuration of an output buffer circuit according to the present invention will hereinafter be described with reference to FIG. 1.

Figure 1:
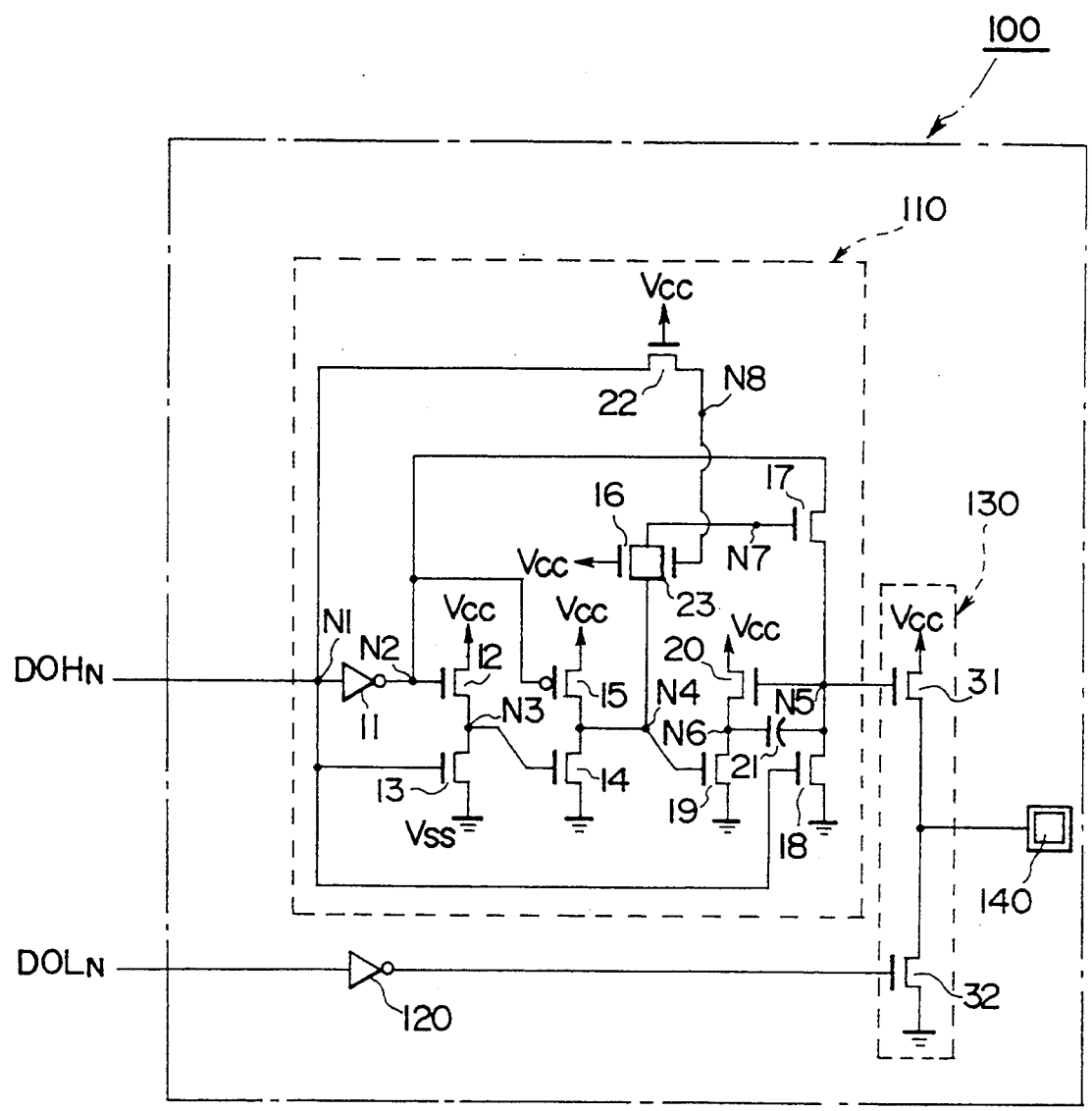
FIG. 1 is a circuit diagram showing an output buffer circuit according to the present invention.

The output buffer circuit 100 shown in FIG. 1 is used in a semiconductor memory such as a dynamic random access memory (DRAM) or the like. The output buffer circuit 100 comprises a bootstrap circuit 110, an inverter 120, an output buffer 130 and an output terminal 140. The bootstrap circuit 110 is supplied with an input signal $DOH_N$ and outputs a signal indicative of a boosted voltage therefrom. The inverter 120 receives an input signal $DOL_N$ therein and outputs a signal obtained by inverting the level of the input signal $DOL_N$. The output buffer 130 is supplied with the boosted-voltage signal and the inverted signal and outputs a signal corresponding to the levels of the boosted-voltage signal and the inverted signal to an output terminal 140.

Circuit configurations of respective components employed in the output buffer circuit will now be described in detail.

The bootstrap circuit 110 comprises an inverter 11, three n-channel MOS transistors (hereinafter called "nMOSs") 12 through 14 which serve as delay means and a p-channel MOS transistor (hereinafter called a "pMOS") 15, an nMOS 16, two nMOSs 17 and 18 each of which serves as an output means, two nMOSs 19 and 20 which serve as charging and discharging means respectively, a boost capacitor 21, and two nMOSs 22 and 23.

The inverter 11 has an input electrically connected to a node N1 for receiving the input signal $DOH_N$ and an output electrically connected to a node N2. The inverter 11 supplies the reverse of the input signal $DOH_N$ to the node N2.

The gate and source of the nMOS 12 are electrically connected to the node N2 and a node N3 respectively. The drain of the nMOS 12 is supplied with a power source potential $V_{CC}$. The gate and drain of the nMOS 13 are electrically connected to the nodes N1 and N3 respectively. The source of the nMOS 13 is supplied with a ground potential $V_{SS}$. The gate and drain of the nMOS 14 are electrically connected to the node N3 and a node N4 respectively. The source of the nMOS 14 is supplied with the ground potential $V_{SS}$. The gate and drain of the pMOS 15 are electrically connected to the nodes N2 and N4 respectively. The source of the nMOS 15 is supplied with the power source potential $V_{CC}$. When a signal having a high potential such as the power source potential $V_{CC}$ (hereinafter called a "$V_{CC}$ level"), which is sufficient to activate the nMOS 13, is supplied to the node N1 as the input signal $DOH_N$, the nMOS 13 is brought into an activated state. With the activation of the nMOS 13, the reverse of the input signal $DOH_N$ supplied to the node N2, for example, a signal having the ground potential $V_{SS}$ (hereinafter called a "$V_{SS}$ level") is supplied to the node N2. When the potential at the node N2 is brought to the $V_{SS}$ level, the nMOS 13 is inactivated. Thus, the pMOS 15 is brought into the activated state. When the pMOS 15 is activated, the ground potential $V_{SS}$ is supplied to the node N3 through the nMOS 13. When the potential at the node N3 is brought to the $V_{SS}$ level, the nMOS 14 is made inactive.

The power source potential $V_{CC}$ is supplied to the node N4 through the pMOS 15 according to the change of states of the nMOSs 14 and 15. In other words, a potential having the $V_{CC}$ level identical to that of the input signal $DOH_N$ is supplied to the node N4 with a time delay. When, on the other hand, a signal having a potential of the $V_{SS}$ level is supplied to the node N1 as the input signal $DOH_N$, the nMOSs 12 through 14 and the pMOS 15 are reversely activated. The potential of the $V_{SS}$ level identical to that of the input signal $DOH_N$ is supplied to the node N4 with a time delay according to the states of the nMOSs 12 through 14 and the pMOS 15.

The source of the nMOS 16 is electrically connected to the node N4, whereas the drain thereof is electrically connected to the gate of the nMOS 17. The gate of the nMOS 16 is supplied with the power source potential $V_{CC}$. When the potential supplied to the node N4 is of the $V_{CC}$ level, the nMOS 16 supplies a potential $V_{CC}$-$V_{T16}$ (where $V_{T16}$ represents the threshold value of the nMOS 16) to the gate of the nMOS 17.

The drain of the nMOS 17 is electrically connected to the node N2, whereas the source thereof is electrically connected to a node N5. The gate and drain of the nMOS 18 are electrically connected to the nodes N1 and N5 respectively. The source of the nMOS 18 is supplied with the ground potential $V_{SS}$. When the signal having the potential of the $V_{CC}$ level is supplied to the node N1 as the input signal $DOH_N$, the nMOS 18 is activated. As described above, the nMOS 17 is also activated when the potential at the node N4 is brought to the $V_{CC}$ level. Further, when the signal having the potential of the $V_{SS}$ level is supplied to the node N1 as the input signal $DOH_N$, the nMOS 18 is brought into an inactivated state. As mentioned above, the nMOS 17 is also inactivated when the potential at the node N4 is brought to the $V_{SS}$ level.

The gate of the nMOS 19 is electrically connected to the node N4, whereas the drain thereof is electrically connected to a node N6. The source of the nMOS 19 is supplied with the ground potential $V_{SS}$. The gate and source of the nMOS 20 are electrically connected to the nodes N5 and N6 respectively. The drain of the nMOS 20 is supplied with the power source $V_{CC}$. The boost capacitor 21 has two electrodes one of which is electrically connected to the node N5 and the other of which is electrically connected to the node N6. When the potential of the input signal $DOH_N$ is of the $V_{CC}$ level, the one electrode of the boost capacitor 21 is supplied with the ground potential $V_{SS}$ under the activation of the nMOS 18. The potential at the node N2, which has been time-delayed by the inverter 11, becomes the $V_{SS}$ level. After the potential at the node N2 has been brought to the $V_{SS}$ level, the potential at the node N4 is brought to the $V_{CC}$ level by the delay means (nMOSs 12 through 14 and pMOS 15). Each of the nMOSs 17 and 19 is activated depending on the potential at the node N4. When the nMOS 19 is made active, the potential at the node N6 becomes the $V_{SS}$ level. In other words, the ground potential $V_{SS}$ is supplied to the other electrode of the boost capacitor 21. Since the ground potential $V_{SS}$ is supplied to both electrodes of the boost capacitor 21, the boost capacitor 21 is not charged. When the potential of the input signal $DOH_N$ is then brought to the $V_{SS}$ level, the nMOS 18 is inactivated. When the nMOS 18 is brought into the inactivated state, the potential at the node N2 still remains at the $V_{SS}$ level and the potential at the node N4 still remains at the $V_{CC}$ level. Since the potentials at the nodes N2 and N4 remain unchanged, the nMOSs 17 and 19 remain activated. According to the states of the nMOSs 17 and 19, the node N5 remains supplied with the potential at the node N2 through the nMOS 17, whereas the node N6 remains supplied with the ground potential $V_{SS}$. The potential at the node N2, which has been delayed in time, is brought to the $V_{CC}$ level. When the potential at the node N2 reaches the $V_{CC}$ level, the potential at the node N4 still remains at the $V_{CC}$ level. Since the potential at the node N4 remains unchanged, each of the nMOSs 17 and 19 is maintained at the activated state. According to the states of the nMOSs 17 and 19, the node N5 remains supplied via the nMOS 17 with the potential at the node N2, which has been brought to the $V_{CC}$ level, whereas the node N6 remains supplied with the ground potential $V_{SS}$. Since the ground potential $V_{SS}$ is supplied to the one electrode of the boost capacitor 21 and the potential at the node N2, which has been brought to the $V_{SS}$ level, is supplied to the other electrode of the boost capacitor 21 through the nMOS 17, the boost capacitor 21 is charged. After the potential at the node N2 has been brought to the $V_{CC}$ level, the potential at the node N4 is also brought to the $V_{SS}$ level by the delay means (nMOSs 12 through 14 and pMOS 15). Each of the nMOSs 17 and 19 is also brought into the inactivated state depending on the potential at the node N4. The node N5 is maintained at the potential at the node N2, which is supplied thereto through the nMOS 17, under the inactivation of the nMOSs 17 and 19. Further, the nMOS 20 is activated. When the nMOS 20 is activated, the node N6 is supplied with a potential $V_{CC}$-$V_{T20}$ (where $V_{T20}$ represents the threshold value of the nMOS 20) through the nMOS 20. Since the potential $V_{CC}$-$V_{T20}$ is supplied to the one electrode of the boost capacitor 21 and the potential at the node N2, which has been brought to the $V_{CC}$ level by the nMOS 17, is supplied to the other electrode of the boost capacitor 21, the boost capacitor 21 is discharged, so that the potential at the node N5 is boosted. The signal having the potential at the node N5 is output as the boosting signal.

The drain of the nMOS 22 is electrically connected to the gate of the nMOS 23, whereas the source thereof is electrically connected to the node N1. The gate of the nMOS 22 is supplied with the power source $V_{CC}$. The source of the nMOS 23 is electrically connected to the node N4, whereas the drain thereof is electrically connected to the gate of the nMOS 17. When the potential of the input signal $DOH_N$ is of the $V_{CC}$ level, a potential $V_{CC}$-$V_{T22}$ (where $V_{T22}$ represents the threshold value of the nMOS 22) is supplied to the gate of the nMOS 23 through the nMOS 22. Thus, the nMOS 23 is activated in response to the potential $V_{CC}$-$V_{T22}$. When the potential of the input signal $DOH_N$ is brought to the $V_{SS}$ level, the nMOS 23 is inactivated.

The output buffer 130 comprises two nMOSs 31 and 32. The gate of the nMOS 31 is electrically connected to the node N5 of the bootstrap circuit 110, whereas the source thereof is electrically connected to the output terminal 140. The drain of the nMOS 31 is supplied with the power source potential $V_{CC}$. The gate of the nMOS 32 is electrically connected to the output of the inverter 120, whereas the drain thereof is electrically connected to the output terminal 140. The source of the nMOS 32 is supplied with the ground potential $V_{SS}$. Thus, each of the nMOSs 31 and 32 is activated or inactivated based on the boosting signal and the inverted signal. The output buffer 130 supplies either the power source potential $V_{CC}$ or the ground potential $V_{SS}$ to the output terminal 140 according to the states of the nMOSs 31 and 32.

Figure 2:
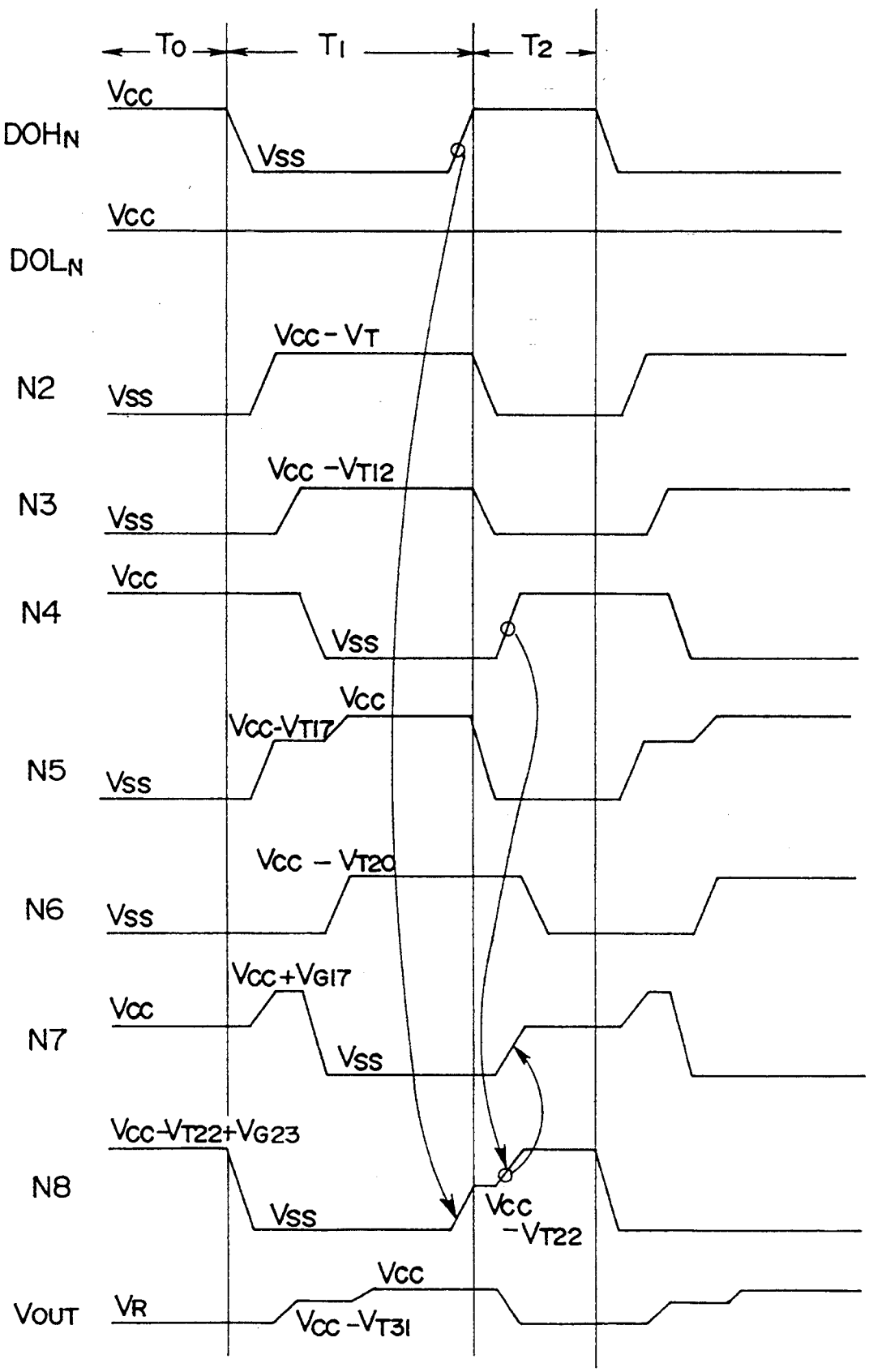
FIG. 2 is a timing chart for describing the operation of the output buffer circuit shown in FIG. 1.

The operation of the output buffer circuit 100 according to the present invention will now be described in detail with reference to FIG. 2. FIG. 2 is a timing chart for describing the operation of the output buffer circuit 100 according to the present invention. A waveform at the node N7, which shows the potential applied to the gate of the nMOS 17, and a waveform at the node N8, which shows the potential applied to the gate of the nMOS 23, are illustrated in FIG. 2 to easily understand the operation of the output buffer circuit 100.

The input signals $DOH_N$ and $DOL_N$ are out of phase with each other. The two signals $DOH_N$ and $DOL_N$ are respectively maintained at the $V_{CC}$ level during a non-operating period $T_0$. Since the gate of the nMOS 32 is supplied with the ground potential $V_{SS}$, the nMOS 32 is brought into the inactivated state. Further, since the potential at the node N1 is of the $V_{CC}$ level, the nMOSs 13 and 18 are brought into the activated state. The potentials at the nodes N3 and N5 reach the $V_{SS}$ level according to the states of the nMOSs 13 and 18. Since the gate of the nMOS 31 is also supplied with the ground potential $V_{SS}$, the nMOS 31 is inactivated. Thus, the output terminal 140 is brought into a floating state (i.e., a predetermined potential $V_R$ (where $V_{SS} < V_R < V_{CC}$)) depending on the states of the nMOSs 31 and 32. The potential at a node N8 is of $V_{CC}$-$V_{T22}$. Since the potential at the node N2 becomes $V_{SS}$, the pMOS 15 is inactivated. The potential at the node N4 is brought to the $V_{CC}$ level according to the state of the pMOS 15. The gate of the nMOS 23 is supplied with the potential $V_{CC}$-$V_{T22}$ before the potential at the node N4 reaches the $V_{CC}$ level. The potential supplied to the source of the nMOS 23 is raised from $V_{SS}$ to $V_{CC}$ depending on the potential at the node N4. Thus, the potential at the node N8 is raised from $V_{CC}$-$V_{T22}$ to $V_{CC}$-$V_{T22}$+$V_{G23}$ (where $V_{G23}$ represents a potential boosted based on the gate capacitance provided between the gate and source of the nMOS 23 and is equal to or greater than $V_{T22}$ (i.e., $V_{G23} \geq V_{T22}$)) based on the gate capacitance created therebetween in response to an increase in potential supplied to the source of the nMOS 23. The potential at the node N7 is brought to the potential ($V_{CC}$) at the node N4 in response to the increase in the potential at the node N8. Further, the potential at the node N6 is brought to the $V_{SS}$ level according to the potential at the node N4.

When the potential of the input signal $DOH_N$ then reaches the $V_{SS}$ level during an operating period $T_1$, the potential at the node N1 is changed to the $V_{SS}$ level. The potential at the node N8 is brought to the $V_{SS}$ level depending upon the potential at the node N8. The nMOS 23 is deactivated and the nMOSs 13 and 18 are inactivated in response to the potential at the node N1. After the input signal has been time-delayed by the inverter 11, the potential at the node N2 is changed to the $V_{CC}$ level. With N2 at $V_{CC}$ the nMOS 12 is brought into the activated state according to the potential at the node N2. When the potential at the node N2 reaches the $V_{CC}$ level, the potential at the node N4 still remains at the $V_{CC}$ level. A potential $V_{CC}$-$V_{T17}$ (where $V_{T17}$ represents the threshold potential of the nMOS 17) corresponding to the potential at the node N2 is supplied to the node N5 through the nMOS 17 activated according to the potentials at the nodes N2 and N4. Thus, the nMOS 20 and the nMOS 31 of the output buffer 130 are activated in response to the potential at the node N8.

The potential at the output terminal 140 is raised according to the activated state of the nMOS 31. Simultaneously with an increase in the potential at the output terminal 140, the potential supplied to the source of the nMOS 17 is raised from the $V_{SS}$ level to the $V_{CC}$-$V_{T17}$ level in a state in which the gate of the nMOS 17 has been supplied with the potential $V_{CC}$. Based on the gate capacitance created between the gate and source of the nMOS 17, the potential supplied to the gate of the nMOS 17 is raised from the $V_{CC}$ level to a $V_{CC}$+$V_{G17}$ (where $V_{G17}$ represents a potential boosted based on the gate capacitance created between the gate and source of the nMOS 17 and is equal to or greater than $V_{T17}$ (i.e., $V_{G17} \geq V_{T17}$)) level. The potential at the node N5 is boosted to the potential ($V_{CC}$ level) at the node N2 according to the increase in the potential of the gate of the nMOS 17. The potential at the output terminal 140 is brought to $V_{CC}$-$V_{T31}$ (where $V_{T31}$ represents the threshold potential of the nMOS 31) according to the increase in the potential at the node N8. The potential at the node N3 becomes $V_{CC}$-$V_{T12}$ (where $V_{T12}$ represents the threshold potential of the nMOS 12) based on the potential at the node N2. The nMOS 14 is activated in response to the potential at the node N3 and the potentials at the nodes N4 and N7 are changed to the $V_{SS}$ level. Each of the nMOSs 17 and 19 is inactivated in response to the potential at the node N4. The potential at the node N5 is maintained at the $V_{CC}$ level according to the state of each of the nMOSs 17 and 19, whereas the potential at the node N6 is changed to the $V_{CC}$-$V_{T20}$ level. Thus, the boost capacitor 21 is discharged in response to an increase in the potential at the node N6. With the discharge of the boost capacitor 21, the potential at the node N5 is raised from the $V_{CC}$ level to a $V_{CC}$+$V_{G21}$ (where $V_{G21}$ represents a potential boosted based on the capacitance of the boost capacitor 21 and is equal to or greater than $V_{T31}$ (i.e., $V_{G21} \geq V_{T31}$)) level. Thus, the potential supplied to the gate of the nMOS 31 of the output buffer 130 is raised with the increase in the potential at the node N5. Further, the potential at the output terminal 140 is changed from the $V_{CC}$-$V_{T31}$ level to the $V_{CC}$ level in response to the increase in the potential applied to the gate of the nMOS 31. In other words, the output buffer circuit 100 can produce a signal having a sufficient potential.

When the input signal $DOH_N$ is brought to the $V_{CC}$ level during a reset period T2, the potential at the node N1 reaches the $V_{CC}$ level. Thus, each of the nMOSs 13 and 18 is activated in response to the potential at the node N1. Further, the potential at each of the nodes N3 and N5 is brought to the $V_{SS}$ level depending on the state of each of the nMOSs 13 and 18. The gate of the nMOS 31 is also supplied with the ground potential $V_{SS}$ depending on the potential at the node N5. Thus, since the nMOS 31 is brought into the inactivated state, the output terminal 140 is brought into the floating state (i.e., the predetermined potential $V_R$ (where $V_{SS} < V_R < V_{CC}$)). Further, the potential at the node N8 is brought to the $V_{CC}$-$V_{T22}$. Since the potential at the node N2 reaches the $V_{SS}$ level, the pMOS 15 is brought into the inactivated state. The potential at the node N4 is brought to the $V_{CC}$ level depending on the state of the pMOS 15. The gate of the nMOS 23 is supplied with the potential $V_{CC}$-$V_{T22}$ before the potential at the node N4 reaches the $V_{CC}$ level. The potential supplied to the source of the nMOS 23 is raised from the $V_{SS}$ level to the $V_{CC}$ level in response to the potential at the node N4. The potential at the node N8 is raised from the $V_{CC}-V_{T22}$ to the $V_{CC}-V_{T22}+V_{G23}$ based on the gate capacitance created between the gate and source of the nMOS 23 in response to the increase in the potential supplied to the source of the nMOS 23. Since the nMOS 23 has the mutual conductance gm larger than that of the nMOS 16, the node N7 is brought to the potential ($V_{CC}$) at the node N4 while following the potential level of the node N4. In other words, the potential at the node N7 becomes the $V_{CC}$ level even during a short reset period. During the operating period, the bootstrap circuit 110 makes it possible to stably set the node N5 to a predetermined potential. The potential at the node N6 is brought to the $V_{SS}$ level in response to the potential at the node N4.

The present invention is not necessarily limited to the above-described embodiment. For example, the polarity of the power source employed in the bootstrap circuit 110 may be changed so that each nMOS be replaced by each pMOS. The elements of structure employed in the output buffer 130 may be replaced with other transistors. Further, other elements may be additionally provided to make the charging or discharging rate of the bootstrap capacitor 21 faster.

What is claimed is:

1. An output buffer circuit comprising:
   an input terminal for receiving an input signal;
   an output circuit coupled to a first node for outputting an output signal in response to a potential level appearing on the first node; and
   a bootstrap circuit coupled between the first node and the input terminal, comprising:
   a delay circuit coupled to the input terminal for delaying the input signal to provide a delayed input signal:
   a first transistor having a drain electrode coupled to the first node, a source electrode coupled for receiving a signal inverted from the input signal, and a gate electrode,
   a second transistor having a source electrode coupled for receiving the delayed input signal, a gate electrode coupled for receiving a first potential level and a drain electrode coupled to the gate electrode of the first transistor;
   a third transistor connected in parallel to the second transistor, the third transistor having a gate electrode;
   a fourth transistor having a source electrode coupled for receiving the input signal, a drain electrode coupled to the gate electrode of the third transistor, and a gate electrode coupled for receiving the first potential level:
   a charge circuit coupled between the delay circuit and the first node for boosting to the first node in response to the potential level appearing on the first node and the delayed input signal.

2. An output buffer circuit according to claim 1, wherein the output circuit includes a MOS transistor having a gate electrode coupled to the first node, a source electrode for outputting the output signal and a drain electrode supplied a power source potential.

3. An output buffer circuit according to claim 1, wherein the third transistor boosts the potential level appearing on the gate electrode thereof when the delayed input signal changes from a low level to a high level.

4. An output buffer circuit according to claim 1, wherein the first transistor boosts the potential level appeared on the gate electrode thereof when the inverted input signal changes from a low level to a high level.

5. An output buffer circuit according to claim I, wherein the charge circuit has a capacitor having a first electrode and a second electrode coupled to the first node, a fifth transistor having a gate electrode coupled for receiving the delayed input signal and a drain electrode coupled to the first electrode of the capacitor, and a sixth transistor having a gate electrode coupled to the first node and a source electrode coupled to the first electrode of the capacitor.

6. An output buffer circuit according to claim 1, wherein the first potential level is power source potential level.

7. An output buffer circuit comprising:
   an input terminal for receiving an input signal;
   an output circuit coupled to a first node for outputting an output signal in response to a potential level appearing on the first node: and
   a bootstrap circuit coupled between the first node and the input terminal, comprising:
   a delay circuit coupled to the input terminal for delaying the input signal to provide a delayed input signal:
   a first transistor having a drain electrode coupled to the first node, a source electrode coupled for receiving a signal inverted from the input signal, and a gate electrode,
   a transfer circuit coupled between the delay circuit and the gate electrode of the first transistor for supplying the delayed input signal to the gate of the first transistor when the delayed input signal changes from a low level to a high level, the transfer circuit being activated in response of the input signal:
   a second transistor having a source electrode coupled for receiving the input signal, a drain electrode coupled to the transfer circuit, and a gate electrode coupled for receiving the first potential level;
   a charge circuit coupled between the delay circuit and the first node for boosting the first node in response to the potential level appearing on the first node and the delayed input signal.

8. An output buffer circuit according to claim 7, wherein the transfer circuit includes a third transistor having a source electrode coupled for receiving the delayed input signal, a gate electrode coupled for receiving the potential level and a drain electrode coupled to the gate electrode of the first transistor, and a fourth transistor connected in parallel to the third transistor, the fourth transistor having a gate electrode.

9. An output buffer circuit according to claim 8, wherein the fourth transistor boosts the potential level appearing on the gate electrode thereof when the delayed input signal changes from a low level to a high level.

10. An output buffer circuit according to claim 8, wherein the first potential level is power source potential level.

11. An output buffer circuit according to claim 7, wherein the output circuit includes a MOS transistor having a gate electrode coupled to the first node, a source electrode for outputting the output signal and a drain electrode supplied a power source potential.

12. An output buffer circuit according to claim 7, wherein the first transistor boosts the potential level appearing on the gate electrode thereof when the inverted input signal changes from a low level to a high level.

13. An output buffer circuit according to claim 7, wherein the charge circuit has a capacitor having a first electrode and a second electrode coupled to the first node, a fifth transistor having a gate electrode coupled for receiving the delayed input signal and a drain electrode coupled to the first electrode of the capacitor, and a sixth transistor having a gate electrode coupled to the first node and a source electrode coupled to the first electrode of the capacitor.

* * * * *